Figure 1:
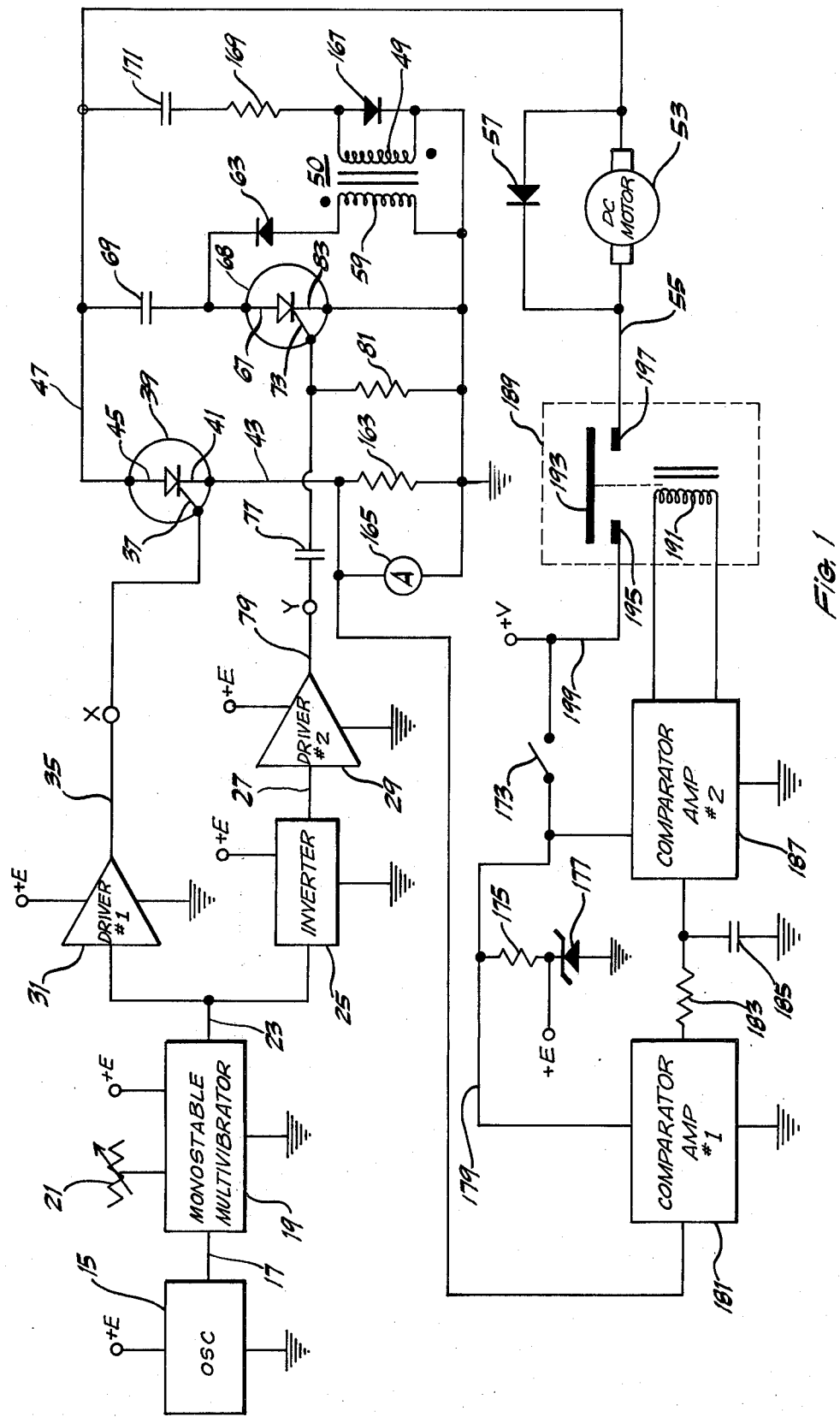

United States Patent [19]

Cameron

[11] 4,052,625
[45] Oct. 4, 1977

[54] MOTOR SPEED CONTROL CIRCUIT WITH OVERLOAD PROTECTION

[76] Inventor: George L. Cameron, 2961 Bostonian Drive, Los Alamitos, Calif. 90720

[21] Appl. No.: 678,181

[22] Filed: Apr. 19, 1976

[51] Int. Cl.$^2$ .................................. H03K 17/08
[52] U.S. Cl. .................. 307/252 K; 307/252 M; 318/345 G; 363/135
[58] Field of Search .............. 307/202, 252 J, 252 K, 307/252 M; 321/44, 45 C; 318/345 G

[56] References Cited

U.S. PATENT DOCUMENTS 3,238,418  3/1966  Heft ...................................... 307/202

Primary Examiner—John Zazworsky
Assistant Examiner—Marcus S. Rasco
Attorney, Agent, or Firm—Raymond L. Madsen

[57] ABSTRACT

There is disclosed an improved switching circuit with overload protection for transforming a source of direct current power into a pulsating voltage of constant frequency and variable pulse duration adapted to be connected through a load to a first controllable rectifier of the switching circuit which in turn is connected through a current sensing resistor to a common circuit ground. The gate electrode of the first controllable rectifier is connected to a source of constant frequency pulses of variable duration. The secondary winding of a current transformer is connected from the common circuit ground in series with a diode, the cathode of which is connected to the anode of a second controllable rectifier, the cathode of the second controllable rectifier being connected to the common circuit ground. The gate of the second controllable rectifier is coupled to a source of pulses which are the exact complement to the pulses applied to the gate of the first controllable rectifier. The primary of the transformer is connected from the common circuit ground in series with a charging capacitor, which in turn is connected to the anode of the first controllable rectifier. The anodes of the first and second controllable rectifiers are connected through a "turn-off" capacitor. A first comparator amplifier has an input connected to the junction of the current sensing resistor and the first controllable rectifier and an output connected through an integrating circuit to a second comparator amplifier, the output of which is connected to a power contactor for applying and removing power to the switching circuit.

4 Claims, 1 Drawing Figure

MOTOR SPEED CONTROL CIRCUIT WITH OVERLOAD PROTECTION

The present invention relates to DC (direct current) switching or chopper circuits for transforming the voltage of a DC source of power into a pulsating voltage of constant frequency and varying pulse duration and more particularly to an improved speed control circuit with overload protection for DC motors.

In U.S. Pat. No. 3,875,486, granted to William J. Barton, there is disclosed a controllable rectifier switching circuit with a widely adjustable pulse timing circuit for supplying direct current pulses of variable duration to a load. The circuit arrangement comprises a commutation capacitor or "turn-off" capacitor, which, via a current transformer and a rectifier, is charged by the leading edges of the pulsating load current and the charge of which is supplied via a second controllable rectifier to the first controllable rectifier for extinguishing same. The primary of the current transformer is connected in series with the first controllable rectifier and the DC load connected thereto.

Although such a switching circuit arrangement has served the purpose, it has not proved entirely satisfactory under all conditions of service for the reasons that the primary of the transformer is connected in series with the load and therefore diminishes the power available to the load by the power losses in the transformer, and further, the current through the primary of the transformer is dependent upon the impedance of the load.

Further, when the load presented to the switching circuit is a DC motor, and the motor is mechanically stalled by overloading, extremely large load currents can be developed causing excessive power dissipation in the motor and the switching circuit to the point of damage or destruction of electrical components.

The general purpose of this invention is to provide a controllable rectifier switching circuit which embraces all the advantages of similarly employed switching circuits and possesses none of the aforedescribed disadvantages. To attain this, the present invention contemplates a unique circuit arrangement of a current transformer and charging and discharging capacitors along with an overload protection circuit whereby loss of power to the load and overload destruction of circuit components are eliminated.

An object of the present invention is the provision of a controllable rectifier switching circuit for transforming the voltage of a source of DC power into a pulsating voltage having a widely adjustable pulse duration wherein there is no current transformer winding in series with the load.

Another object is to provide a controllable rectifier DC chopper circuit wherein the power is removed from the circuit whenever the integral of the load current exceeds a predetermined overload value.

Other objects and many of the attendant advantages of this invention will be readily appreciated as the same becomes better understood by reference to the following detailed description, when considered in connection with the accompanying drawing.

FIG. 1 illustrates a circuit diagram, partly in block form, of a preferred embodiment of the present invention.

Referring now to the drawing, there is shown a constant frequency oscillator 15 connected by line 17 to a monostable multivibrator 19 having an adjustable resistance 21 connected thereto to control the pulse duration of the constant frequency pulse at output line 23. Monostable multivibrator 19 is further connected by line 23 to inverter 25 which in turn is connected by line 27 to driver 29, further identified as Driver No. 2. Line 23 is further connected to driver 31 further designed as Driver No. 1, which in turn is connected to line 35, also designated as terminal X to control gate 37 of controllable rectifier 39. Controllable rectifier 39 has cathode 41 thereof connected by line 43 through a current sensing resistor 163 which in turn is connected in parallel with an ammeter 165 to a common circuit ground. Anode 45 of controllable rectifier 39 is connected by line 47 to one terminal of DC motor 53. The other terminal motor 53 is connected by line 55 to contact 197 of a power contactor 189. Diode 57 is connected across motor 53 having the anode thereof connected to line 47 and the cathode to line 55. Secondary winding 59 of current transformer 50 has one side thereof connected to the common circuit ground and the other side thereof connected to the anode of charging diode 63. The cathode of diode 63 is connected to anode 67 of controllable rectifier 68. "Turn-off" or commutating capacitor 69 is connected from anode 67 of controllable rectifier 68 to anode 45 of controllable rectifier 39. Control gate 73 of controllable rectifier 68 is connected to one end of capacitor 77, the other end of capacitor 77 being connected to line 79, which is the output of Driver No. 2 and also designated as terminal Y. Resistor 81 is connected between control gate 73 and the common circuit ground. Cathode 83 of controllable rectifier 68 is connected to the common circuit ground.

Primary winding 49 of current transformer 50 has one end thereof connected to the common circuit ground and the other end connected through resistor 169 and charging capacitor 171 to line 47. Diode 167 is connected across primary winding 49 having the cathode thereof connected to common circuit ground and the anode thereof connected to the junction of primary winding 49 and resistor 169.

The junction of current sensing resistor 163 and controllable rectifier 39 is connected by line 43 to the input to voltage sensitive anplifier 181 further designated as Comparator Amplifier No. 1. The output of voltage sensitive amplifier 181 is connected through resistor 183 to the input of voltage sensitive amplifier 187, also designated as Comparator Amplifier No. 2. Capacitor 185 is connected between common circuit ground and the input to voltage sensitive amplifier 187. The putout of comparator amplifier 187 is further connected to electromagnetic winding 191 of power contactor 189. Contactor arm 193 is moved by electromagnetic winding 191 to make or break contact between contacts 197 and 195 of power contactor 189. Contact 195 is further connected by line 199 to a positive source of DC power designated as +V. Switch 173 is connected between line 199 and 179, which in turn is connected to voltage sensitive amplifiers 181 and 187 to provide DC power thereto. Line 179 is further connected through resistor 175 to the cathode of zener diode 177, which in turn has the anode thereof connected to common circuit ground. The junction between resistor 175 and zener diode 177 provides a source of +E voltage to supply power to oscillator 15, monostable multivibrator 19, inverter 25 and Drivers No. 1 and No. 2.

Operation of the improved switching circuit can best be described by reference to the drawing. The periodic signal of constant frequency oscillator 15 triggers monostable multivibrator 19 to produce a pulse of varying width at line 23, the width of the pulse being controlled from substantially zero width to approximately 95% of the period of the constant frequency by variable resistor 21 in a conventional manner well known to the electronic circuit designer. Driver No. 1 provides a low impedance output to control gate 37 of controllable rectifier 39. The pulse output of the monostable multivibrator is positive with reference to the common circuit ground as is also the pulse at the output of driver No. 2. The positive pulse at control gate 37 turns "on" controllable rectifier 39 and causes it to be conductive in a low impedance state. Therefore, when conducting arm 193 connects contacts 195 and 197, a load current flows from +V through power contactor 189, motor 53, and controllable rectifier 39 to the common circuit ground. During this condition, motor 53 is activated.

Prior to the turning "on" of controllable rectifier 39, substantially no load current was flowing through motor 53 and therefore charging capacitor 171 was charged through resistor 169 and diode 167 to a voltage approaching +V. When controllable rectifier 39 is turned "on", line 47 drops to the voltage across current sensing resistor 163 which is slightly above circuit ground potential. Therefore, capacitor 171 then discharges through conducting controllable rectifier 39 and current sensing resistor 163, primary winding 49 of transformer 50 and current limiting resistor 169. The discharge current from capacitor 171 is conducted through primary winding 49 of current transformer 50, reverse biasing diode 167. The current is transformed through transformer 50 to secondary winding 59 which is poled in such a manner that the current conducted in the secondary forward biases diode 63 and is conducted therethrough to charge "turn-off" capacitor 69 through line 47 and controllable rectifier 39, which is in a conducting state. The size of capacitor 171 and resistor 169 are chosen to produce sufficient primary current in transformer 50 to charge capacitor 69 with sufficient energy to turn "off" controllable rectifier 39 when controllable rectifier 68 is turned "on".

All during the time of conduction of controllable rectifier 39, controllable rectifier 68 is maintained "off" by resistor 81 connected between control gate 73 and the common circuit ground. When the output pulse from the monostable multivibrator drops back to substantially zero at line 23, inverter 25 produces a positive going pulse at line 27 which in turn appears at line 79 at the output of driver No. 2 to produce a positive going pulse at terminal Y. This pulse is capacitively coupled to capacitor 77 to control gate 73 of controllable rectifier 68, turning "on" controllable rectifier 68 and causing it to conduct in a low impedance state. "Turn-off" or commutating capacitor 69, which has been charged up to a positive voltage between the anode of controllable rectifier 68 and line 47, can now discharge through conducting controllable rectifier 68. To turn "off" controllable rectifier 39, the discharge current of capacitor 69 must be larger than the load current conducted through controllable rectifier 39 such that the current therethrough is momentarily reduced to zero and the voltage thereacross is reversed by the remaining voltage across capacitor 69. Capacitor 69 then charges in the reverse direction through motor 53 and conducting controllable rectifier 68. Under this circuit condition, capacitor 69 charges toward +V, such that if allowed to complete its charging, the terminal of capacitor 69 connected to line 47 will be +V volts with respect to the capacitor terminal connected to anode 67 of controllable rectifier 68.

Coupling capacitor 77 is chosen to differentiate the leading edge of the positive pulse applied thereto to turn "on" controllable rectifier 68 such that on the differentiated leading edge is applied to control gate 73 as a voltage spike to turn "on" controllable rectifier 68. This enables a short "on" period for controllable rectifier 68 in the event a large pulse width is being generated by monostable multivibrator 19, whereby controllable rectifier 39 is only "off" for a short period of time. During the time of reverse charging of "turn off" or commutating capacitor 69 through conducting controllable rectifier 68, the secondary winding 59 of transformer 50 is attempting to conduct current therethrough in the direction to reverse bias charging diode 63, thereby preventing any current flow in secondary winding 59 which would reduce the current through controllable rectifier 68 and possibly cause premature turn "off".

During the interval of conduction of controllable rectifier 68, no power is delivered to motor 53 and motor 53 is coasting or "free wheeling". It is possible during this interval that the motor can generate voltages across its terminals which would cause the voltage at line 47 to exceed +V volts. Diode 57 connected across the motor in the direction illustrated clamps line 47 to +V and prevents the voltage on line 47 from exceeding +V.

When the next pulse appears at the output of the monostable multivibrator 19, controllable rectifier 39 is again turned "on" causing turn off or commutating capacitors 69 to discharge through conducting controllable rectifier 39, thereby reducing the current to zero in controllable rectifier 68 and applying a reverse voltage thereacross to turn "off" controllable rectifier 68. "Turn-off" or commutating capacitor 69 is then charged through diode 63 from secondary winding 59 of transformer 50 in the manner as described hereinabove and the process repeats itself. During duration of the "on" time of controllable rectifier 39 as controlled by the timed duration of the pulse applied to control gate 37, motor 53 increases in speed. When controllable rectifier 68 is "on" and 39 is "off", the duration of the constant frequency pulses of the pulsating power controls the motor speed.

The overload circuit functions in the following manner. Under normal conditions of operation, a voltage is developed across current sensing resistor 163 in parallel with ammeter 165 when controllable rectifier 39 is in a conducting condition, which voltage is proportional to the load current being conducted through the DC motor. When the DC motor is running, i.e., the armature turning, the time integral of the load current pulses, regardless of their duration, is below a certain predetermined power overload value. When the DC motor is stalled, due to an excessive mechanical loading, the armature stops turning and the current pulses through the motor and conducting controllable rectifier 39 increases in magnitude to a value determined by the motor resistance and the voltage of the source of direct current power. When the motor is supplied power in the stalled condition, the integral of the load current pulses, as their duration is increased, will exceed the predetermined overload value chosen to protect the electrical components from damage or destruction. Therefore, under normal conditions, the voltage across current sensing resistor 163 is below a certain overload voltage or reference voltage which is designated into comparator amplifier No. 1. Comparator amplifiers No. 1 and No. 2 are of the conventional type of voltage sensitive amplifiers well known to the electronic circuit designer. When the voltage across current sensing resistor 163 is below the threshold or overload voltage as designed in comparator amplifier No. 1, the output of comparator No. 1 is in a low voltage output condition and assumes a high voltage output condition when the voltage across current sensing resistor 163 exceeds the threshold voltage of comparator amplifier No. 1 equivalent to the present overload voltage for the circuit. Upon the output of comparator amplifier No. 1, switching into the high voltage output condition, capacitor 185 charges through resistor 183 towards that high voltage output.

Comparator amplifier No. 2 has an input threshold voltage designed therein such that when the input connected to capacitor 183 is below this predesigned threshold voltage, the output of comparator amplifier No. 2 produces a driving voltage to winding 191 of power contactor 189 closing contacts 195 and 197 with contactor arm 193 and applying power through the DC motor 53 to the switching circuit. When the voltage across capacitor 185 exceeds the threshold voltage of comparator amplifier No. 2, the driving voltage is removed from winding 191 and the power contactor is opened to remove power from the DC motor and the switching circuit.

Since the overload condition of the switching circuit is concerned with the time average of the overload current through controllable rectifier 39 and current sensing resistor 163, comparator amplifier No. 1 will follow every pulse of current conducted by controllable rectifier 39 which is in excess of the predetermined overload value and the output of comparator amplifier No. 1 will switch to its high output voltage condition for the length of time overload current is flowing through current sensing resistor 163. Therefore, if the overload current pulses through current sensing resistor 163 are of short duration, the voltage developed across integrating capacitor 185 will not exceed the threshold voltage of comparator amplifier No. 2, and therefore, comparator amplifier No. 2 will continue to generate a driving voltage output to operate power contactor 189 and supply power through the DC motor and the switching circuit. However, as the current pulse duration increases to supply more power to the stalled motor, the voltage across capacitor 185 increases and eventually will reach and exceed the value of the threshold voltage of comparator amplifier No. 2 and remove the driving voltage to winding 191 of the power contactor, opening contacts 195 and 197 to remove power from the DC motor and switching circuit. Consequently, the integrating circuit comprising resistor 183 and capacitor 185 integrates and smooths out the voltage pulses appearing at the output of comparator amplifier No. 1 to produce a voltage across capacitor 185 proportional to the time the current pulses being conducted through current sensing resistor 163 exceed the predetermined overload value. This prevents comparator amplifier No. 2 from being operated on every overload current pulse being conducted through current sensing resistor 163 even if that pulse were of a short duration. Since the overload condition is concerned with average power dissipation in the electrical components of the switching circuit and this power dissipation is proportional to the average of the product of time and the overload current pulses, the integrating circuit of resistor 183 and capacitor 185 performs this averaging and produces a voltage across capacitor 185 proportional or related to the product of the predetermined current overload value and the time the overload value is exceeded by the current pulses being conducted through current sensing resistor 163. Therefore, the overload circuit will not remove power from the DC motor and switching circuit until an overload current pulse duration is reached such that the integral of the overload current exceeds a predetermined overload threshold determined by the voltage reference designed in the comparator amplifier No. 2.

It now should be apparent that the present invention provides a controllable rectifier circuit arrangement which may be employed in conjunction with a motor to which a varying power is desired to be supplied, which circuit is characterized by a common circuit ground, a single current transformer of which no winding is in series with the motor to reduce the power supplied thereto and a power overload circuit configuration to remove power to the motor and the switching circuit when the integral of the overload current conducted therethrough exceeds a certain predetermined value.

Although particular components, etc., have been discussed in connection with the specific embodiment of a controllable rectifier circuit, constructed in accordance with the teachings of the present invention, others may be utilized. Furthermore, it will be understood that although an exemplary embodiment of the present invention has been disclosed and discussed, other applications and circuit arrangements are possible and that the embodiments disclosed may be subjected to various changes, modifications and substitutions without necessarily departing from the spirit of the invention.

What is claimed is:

1. A switching circuit responsive to two complementary constant frequency pulses of variable duration for the controlled application of direct current power through a load, comprising:

a first controlled rectifier having an anode, a cathode and a gate electrode, said cathode being adapted to be connected to a common circuit ground, said gate electrode and said common ground being adapted to be connected to a source of one of two complementary constant frequency pulses of variable duration for rendering said first controlled rectifier conductive;

a second controlled rectifier having an anode, a cathode and a gate electrode, said cathode being connected to said common circuit ground, said gate electrode and said common ground being adapted to be connected to a source of the other of said two complementary constant frequency pulses of variable duration for rendering said second controlled rectifier conductive;

a turn-off capacitor connected between the anodes of said first and second controlled rectifiers for rendering said first controlled rectifier non-conductive when said second controlled rectifier is rendered conductive;

a transformer having primary and secondary windings, each of said primary and secondary windings having one end thereof connected to said common circuit ground, the polarity of the secondary winding being selected such that a current is conducted from the other end of said secondary winding in response to a current entering said one end of the primary winding;

a charging diode having an anode and a cathode, said anode being connected to said other end of said secondary winding of said transformer, said cathode being connected to said anode of said second controlled rectifier and to one end of said turn-off capacitor for conducting a current from said secondary winding to charge said turn-off capacitor when said first controlled rectifier is rendered conductive;

a second diode having an anode and a cathode, said anode being connected to said other end of said primary winding of said transformer, said cathode being connected to said one end of said primary winding; and a charging capacitor being connected between said anode of said first controlled rectifier and the other end of said primary winding of said transformer, said charging capacitor being charged through said second diode when said second controlled rectifier is rendered conductive, said charging capacitor being discharged through said primary winding of said transformer and thereby inducing a current in said secondary winding to charge said turn-off capacitor when said first controlled rectifier is rendered conductive.

2. The switching circuit described in claim 1 further including:

a current sensing resistor connected between said cathode of said first controlled rectifier and said common circuit ground for developing a voltage thereacross proportional to the current conducted through said first controlled rectifier;

first voltage sensitive means having an input and an output, said input being connected to the junction of said current sensing resistor and said first controlled rectifier, said first voltage sensing means producing a first voltage at said output when the magnitude of said voltage across said current sensing resistor is less than a predetermined overload value and producing a second voltage at said output when said voltage across said current sensing resistor is greater than said overload value, said second voltage being greater in magnitude than said first voltage;

integrating means connected to said output of said first voltage sensitive means, said integrating means providing an output voltage related to the duration of time the voltage across said current sensing resistor is greater than said overload value;

second voltage sensitive means having an input and an output, said input being connected to the output of said integrating means, said second voltage sensitive means producing a driving voltage at said output when the magnitude of said integrating means output voltage is below a second predetermined value and said output having substantially no driving voltage when the magnitude of said integrating means output voltage exceeds said second predetermining value; and power connector means connected to said output of said second voltage sensitive means and being adapted to connect a source of direct current power to said switching circuit when substantially no driving voltage is present at said output of said second voltage sensitive means and to disconnect said power when driving voltage is present at said output of said second voltage sensitive means, thereby preventing an overload current from being conducted through said first controlled rectifier and the load connected thereto.

3. The switching circuit described in claim 2 wherein said first and second voltage sensing means are comparator amplifiers.

4. The switching circuit described in claim 2 wherein said integrating means comprises a series resistor and capacitor connected between said output of said first voltage sensitive means and said common circuit ground, said series resistor being connected to said output and said capacitor being connected to said common circuit ground, said output voltage of said integrating means being across said capacitor.

* * * * *